United States Patent
Ishihara et al.

(10) Patent No.: US 9,385,063 B2
(45) Date of Patent: Jul. 5, 2016

(54) THERMALLY CONDUCTIVE SHEET FEEDER AND METHOD FOR FEEDING THERMALLY CONDUCTIVE SHEET

(71) Applicant: SHIN-ETSU CHEMICAL CO., LTD., Tokyo (JP)

(72) Inventors: Yasuhisa Ishihara, Annaka (JP); Akihiro Endo, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 12 days.

(21) Appl. No.: 14/390,669

(22) PCT Filed: Mar. 29, 2013

(86) PCT No.: PCT/JP2013/002186
§ 371 (c)(1),
(2) Date: Oct. 3, 2014

(87) PCT Pub. No.: WO2013/171960
PCT Pub. Date: Nov. 21, 2013

(65) Prior Publication Data
US 2015/0093219 A1    Apr. 2, 2015

(30) Foreign Application Priority Data
May 14, 2012  (JP) .................................. 2012-110662

(51) Int. Cl.
*H01K 13/02* (2006.01)
*H01L 23/367* (2006.01)
(Continued)

(52) U.S. Cl.
CPC ............. *H01L 23/3672* (2013.01); *B25J 11/00* (2013.01); *B65D 73/02* (2013.01); *H01L 23/3737* (2013.01); *H05K 13/0084* (2013.01); *B65B 15/04* (2013.01); *H01L 2924/0002* (2013.01)

(58) Field of Classification Search
CPC  H01L 23/3737; H01L 23/36; H05K 13/0084; B65D 73/02
USPC .......................................................... 428/76
See application file for complete search history.

(56) References Cited

U.S. PATENT DOCUMENTS

2003/0151898 A1    8/2003  Tetsuka et al.
2003/0180484 A1    9/2003  Imai et al.
(Continued)

FOREIGN PATENT DOCUMENTS

JP    H05-310264 A    11/1993
JP    H07-149365 A     6/1995
(Continued)

OTHER PUBLICATIONS

International Search Report issued in International Patent Application No. PCT/JP2013/002186 dated Jun. 25, 2013.
(Continued)

*Primary Examiner* — Alexander Thomas
(74) *Attorney, Agent, or Firm* — Oliff PLC

(57) ABSTRACT

Provided by the present invention are a thermally conductive sheet feeder and a method for feeding a thermally conductive sheet, which are a thermally conductive sheet feeder and a method for feeding a thermally conductive sheet using an emboss carrier tape, wherein the emboss carrier tape provided on its surface with a plurality of pockets, each having one thermally conductive sheet accommodated therein, and a cover film to protect surface of the emboss carrier tape are rolled up in a reel-like form.

10 Claims, 2 Drawing Sheets

(51) Int. Cl.
  *H01L 23/373* (2006.01)
  *H05K 13/00* (2006.01)
  *B25J 11/00* (2006.01)
  *B65D 73/02* (2006.01)
  *B65B 15/04* (2006.01)

(56) References Cited

U.S. PATENT DOCUMENTS

2010/0294780 A1  11/2010  Jewran et al.
2012/0003429 A1   1/2012  Iwasaki et al.

FOREIGN PATENT DOCUMENTS

| JP | A-11-292188 | 10/1999 |
| JP | 2002-080617 A | 3/2002 |
| JP | A-2003-26280 | 1/2003 |
| JP | 2004-039829 A | 2/2004 |
| JP | A-2005-228955 | 8/2005 |
| JP | A-2008-120445 | 5/2008 |
| JP | A-2009-123766 | 6/2009 |
| JP | 2010-010599 A | 1/2010 |
| JP | A-2011-225257 | 11/2011 |
| JP | A-2012-12033 | 1/2012 |
| WO | WO 2010/104010 A1 | 9/2010 |

OTHER PUBLICATIONS

Nov. 18, 2014 International Preliminary Report on Patentability issued in International Application No. PCT/JP2013/002186.
Jun. 23, 2015 Office Action issued in Japanese Application No. 2012-110662.
Jan. 4, 2016 extended European Search Report issued in Application No. 13791319.0.
Feb. 2, 2016 Office Action issued in Japanese Patent Application No. 2012-110662.

MOUNTING CANNOT BE DONE PROPERLY

THERMALLY CONDUCTIVE SHEET FEEDER AND METHOD FOR FEEDING THERMALLY CONDUCTIVE SHEET

TECHNICAL FIELD

The present invention relates to a thermally conductive sheet feeder and to a method for feeding a thermally conductive sheet.

BACKGROUND ART

As LSI chip, including CPU, driver IC, and memory that are used in electronic devices such as a personal computer, a digital video disc, and a cell phone, advances toward a higher performance, a higher speed, further downsizing, and a higher integration, they themselves generate significant heat thereby leading to temperature rise of the chip due to this heat, which in turn causes malfunction and destruction of the chip. Therefore, in order to suppress the temperature rise of the chip in action, many methods for heat diffusion and heat-diffusing members used for it have been proposed.

In the past, in electronic devices and so forth, in order to suppress the temperature rise of the chip in action, a heat sink in which a metal plate having a high thermal conductivity made of such materials as aluminum and copper has been used. This heat sink conducts a heat generated by the chip thereby releasing the heat from its surface by utilizing the temperature difference with the outer environment.

In order to efficiently conduct the heat generated from the chip to the heat sink, it is necessary to intimately contact the heat sink to the chip; however, there are a difference in heights among chips and a tolerance caused by assembling of them. Therefore, a flexible sheet or grease is inserted between the chip and the heat sink, whereby thermal conduction is realized from the chip to the heat sink through the sheet or the grease.

A heat-releasing material in the grease form can be made thin, and thus, this is an excellent heat-releasing material; however, this material is difficult to be controlled. Coating of it is done manually by screen printing or by extrusion from a syringe, or automatically by using a dispenser. However, these methods require a very long time; and besides of it, handling thereof is not easy whereby this process sometimes becomes a bottleneck of a product assembly line.

On the other hand, as to the thermally conductive sheet, mounting thereof can be done merely by adhering it; and thus, a special equipment for it is not necessary, so that handling and control thereof are easier than the grease. However, the adhesion thereof is mostly done manually; and thus, this work is extremely inefficient whereby this process sometimes becomes a bottleneck of a product assembly line. Accordingly, remarkable improvement in productivity may be expected if the mounting process of the thermally conductive sheet can be done automatically by a method using a vacuum nozzle or the like which now became a mainstream method in mounting of a semiconductor part.

As to a feeding method of a thermally conductive sheet to an automatic mounting equipment by using a vacuum nozzle or the like, there is a method in which thermally conductive sheets each of which is previously cut into a prescribed size are set out on a substrate such as a PET film or on a resin tray, whereby the sheets are taken up one by one by means of a vacuum nozzle. However, in this feeding method, the thermally conductive sheets are set out in a plane thereby requiring a very large space; and in addition, the distance to transport the sheet that is suck up by the vacuum nozzle to the mounting site is different in each sheet. Moreover, there was a problem that if number of the thermally conductive sheets that were set out in a plane was large, the distance to the mounting site became so long whereby increasing a risk to drop the sheet from the nozzle.

CITATION LIST

Patent Literature

PATENT LITERATURE 1: Japanese Patent Laid-Open Publication No. 2008-120445
PATENT LITERATURE 2: Japanese Patent Laid-Open Publication No. 2011-225257
PATENT LITERATURE 3: Japanese Patent Laid-Open Publication No. H11-292188
PATENT LITERATURE 4: Japanese Patent Laid-Open Publication No. 2003-26280
PATENT LITERATURE 5: Japanese Patent Laid-Open Publication No. 2012-12033

SUMMARY OF THE INVENTION

Technical Problem

Present invention was made in view of the situation as mentioned above, and thus, an object thereof is to provide a thermally conductive sheet feeder and a method for feeding a thermally conductive sheet, wherein an emboss carrier tape is used in both of the above.

Solution to Problem

To solve the problems mentioned above, in the present invention, a thermally conductive sheet feeder is provided, wherein an emboss carrier tape provided on its surface with a plurality of pockets, each having one thermally conductive sheet accommodated therein, and a cover film to protect surface of the emboss carrier tape are rolled up in a reel-like form.

According to the thermally conductive sheet feeder as mentioned above, many thermally conductive sheets may be arranged without spreading them in a plane. Moreover, because each of the thermally conductive sheets can be taken up at a fixed position by sending the tape little by little with peeling the cover film off, the vacuum nozzle needs only a regular movement, so that movement of the nozzle can be simplified; and as a result, a chance of failure in the mounting process can be reduced, so that the automatic mounting process may be made more simple and efficient.

Further in the present invention, a tacking energy of at least one surface of the thermally conductive sheet is preferably 70 µJ or less.

The thermally conductive sheet as mentioned above can be fed by sucking up this sheet by means of a vacuum nozzle without attaching thereof to the cover film or to the pocket's bottom surface of the emboss carrier tape.

Further in the present invention, the thermally conductive sheet is preferably a laminate of a reinforcing layer and a thermally conductive resin layer.

In the thermally conductive sheet as mentioned above, thanks to the action of the reinforcing layer, it is possible to prevent the thermally conductive sheet from moving to a corner in the pocket or from bending; in addition, thanks to the action of the thermally conductive resin layer, intimate contact between a heat-generating part and a cooling part can be bettered, so that this sheet can have the heat-releasing effect.

In addition, thickness of the thermally conductive sheet is preferably in the range of 60 μm or more to 600 μm or less.

If the thickness thereof is within the above range, stress between the heat-generating member and a cooling member can be relaxed; and thus, a further bettered sheet-moldability can be obtained.

In addition, thermal conductivity of the thermally conductive resin layer is preferably 1.0 W/mK or more, or more preferably 3.0 W/mK or more.

If the thermal conductivity thereof is as mentioned above, the thermally conductive sheet can be used in a heat-generating part in which a large heat is generated.

It is preferable that the thermally conductive resin layer contains 300 parts by mass or more of thermally conductive filler relative to 100 parts by mass of a silicone resin.

If the thermally conductive resin layer as mentioned above is used, sufficient thermal conductivity of the thermally conductive resin layer can be obtained.

The reinforcing layer is preferably an aluminum foil.

The reinforcing layer as mentioned above is relatively inexpensive, and can keep stability of a product thereof.

Provided herein is a method for feeding a thermally conductive sheet wherein a thermally conductive sheet accommodated in a pocket of the emboss carrier tape of the thermally conductive sheet feeder is fed by sucking up the sheet one by one from the pocket by using a vacuum nozzle whereby carrying out an automatic mounting thereof.

According to the method for feeding a thermally conductive sheet of the present invention, the automatic mounting process of a thermally conductive sheet may be made more simple and efficient.

Advantageous Effects of Invention

As mentioned above, according to the present invention with regard to the thermally conductive sheet feeder and the method for feeding a thermally conductive sheet, many thermally conductive sheets may be arranged without spreading them in a plane; and in addition, because each of the thermally conductive sheets can be taken up at a fixed position by sending the tape little by little with peeling the cover film off, the vacuum nozzle needs only a regular movement, so that movement of the nozzle can be simplified; and as a result, a chance of failure in the mounting process can be reduced, so that the automatic mounting process may be made more simple and efficient.

DESCRIPTION OF EMBODIMENTS

Inventors of the present invention carried out an extensive investigation to achieve the object as mentioned above; and as a result, they found a method for feeding wherein an emboss carrier tape is used in the process to suck up the sheet thereby transporting it to a mounting site and a thermally conductive sheet feeder wherein each of the thermally conductive sheets is accommodated in each pocket of the emboss carrier tape, and after surface of this carrier tape is protected by a cover film, the tape is rolled up in a reel-like form.

According to this method and the feeder, many thermally conductive sheets may be arranged without spreading them in a plane; and in addition, because each of the thermally conductive sheets can be taken up at a fixed position by sending the tape little by little with peeling the cover film off, the vacuum nozzle needs only a regular movement, so the movement of the nozzle can be simplified; and as a result, a chance of failure in the mounting process can be reduced, so that the automatic mounting process may be made more simple and efficient.

A feeding method which uses an emboss carrier tape has been known as a feeding method of a semiconductor part which is very small and fragile (Patent Literatures 1 to 4); however, there has been no report of it as the feeding method of a thermally conductive sheet.

Therefore, according to the present invention with regard to the thermally conductive sheet feeder and the method for feeding a thermally conductive sheet, it was found that the automatic mounting process of a thermally conductive sheet can be made more simple and efficient; and based on this found information, the present invention could be completed.

That is, the present invention is a thermally conductive sheet feeder wherein an emboss carrier tape provided on its surface with a plurality of pockets, each having one thermally conductive sheet accommodated therein, and a cover film to protect surface of the emboss carrier tape are rolled up in a reel-like form.

Figure 1A:
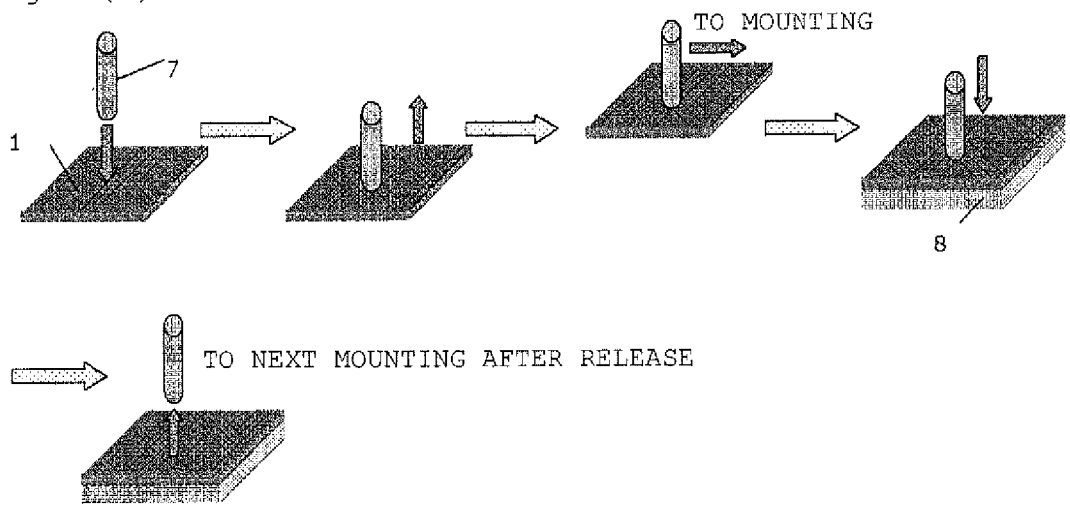
FIG. 1(A) shows one example of the automatic mounting process according to the present invention with regard to the thermally conductive sheet feeder and the method for feeding a thermally conductive sheet.
Figure 1B:
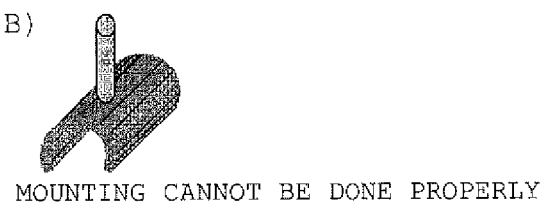
FIG. 1(B) shows a failure example of the mounting without following the present invention with regard to the thermally conductive sheet feeder and the method for feeding a thermally conductive sheet.
Figure 2:
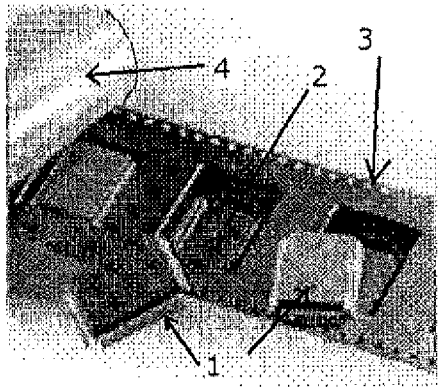
FIG. 2 shows one example of components of the thermally conductive sheet feeder of the present invention, comprising the emboss carrier tape having the pockets, the thermally conductive sheets, and the cover film.
Figure 3:
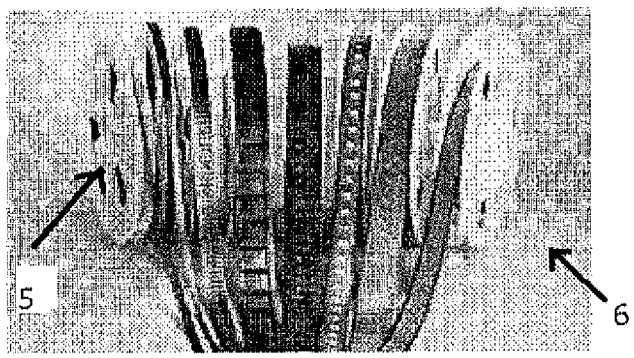
FIG. 3 shows one example of the thermally conductive sheet feeder of the present invention that is rolled up in a reel-like form.

As shown in FIG. 1 to FIG. 3, according to the present invention with regard to the thermally conductive sheet feeder 6 wherein the emboss carrier tape 3 provided on its surface with a plurality of pockets 2, each having one thermally conductive sheet 1 accommodated therein, and a cover film 4 to protect surface of the emboss carrier tape 3 are rolled up in a reel-like form 5 and the method for feeding a thermally conductive sheet using the same, the thermally conductive sheet 1 can be sucked up properly by the vacuum nozzle 7, so that the sheet may be mounted, for example, on the semiconductor chip 8; and as a result, the automatic mounting process of the thermally conductive sheet 1 may be made more simple and efficient.

Hereunder, the present invention will be explained in detail.

Emboss Carrier Tape:

An emboss carrier tape which is widely used especially in accommodating, among semiconductor parts, a part which is very small and fragile may be commuted. Many inventions have been made on the emboss carrier tape for transportation of a semiconductor part; and some examples thereof can be found in Patent Literatures 1 to 4. The material is preferably a polycarbonate in view of heat resistance and weather resistance.

Size of the emboss pocket is preferably larger than the sheet's size in both horizontal and vertical sides by about 10 to 20%. With this size, there is neither a risk that the thermally conductive sheet is held in the pocket during the time of sucking up of it by means of a nozzle nor a risk that the thermally conductive sheet moves in the pocket during transportation thereof; and thus, the sucking-up thereof can be done properly.

In order to avoid contact of the thermally conductive sheet with the bottom surface as far as possible, it is preferable to form projections in four corners of the pocket's bottom surface or salients on the both ends of the pocket's bottom surface. By forming projections or salients as mentioned above, the thermally conductive sheet may be sucked up by a vacuum nozzle without problems.

In this case, shape of the projection or the salient is preferably a shape not injuring the thermally conductive sheet.

Depth of the pocket is preferably such that there is an allowance of about 3 to 5 mm above the thermally conductive sheet when it is accommodated therein. If there is an allowance like this, there is no risk that the thermally conductive sheet comes out from the pocket during the process when the thermally conductive sheet is accommodated therein and the tape is protected by a cover film; besides, this does not pose an obstacle during sucking-up of the thermally conductive sheet.

Distance between the pockets is arbitrary; however, the distance of about 5 mm is preferable.

Length of the emboss carrier tape of the present invention may be made from a several ten meters to a several hundred meters; and if size of the thermally conductive sheet is a several ten millimeters in each side, a several thousand sheets may be accommodated therein.

Cover Film:

There are many invention as to the cover film of the emboss carrier tape for transportation of a semiconductor part (Patent Literature 5); however, in the present invention, a cover film which is widely used especially in protecting, among semiconductor parts, a part which is very small and fragile may be commuted. The material is preferably a polyester film or the like.

It is necessary to adhere the emboss carrier tape with the cover film; and as to this method, there are a method in which the adhesion is done by applying an adhesive on the edge of the cover film and a method in which the adhesion is done by hot-pressing the carrier tape and the cover film.

The adhesion strength is preferably such that with it the adhesion may withstand vibration, heat, and thermal shock during transportation of the thermally conductive sheet and may be stable with passage of time. If the adhesion strength is too weak, the tape is peeled off during transportation, while if the adhesion is too strong, an extra burden is necessary to peel the tape off during the mounting process.

Tacking Energy:

In the present invention, a tacking energy of at least one surface of the thermally conductive sheet is preferably 70 μJ or less.

The tacking energy of the thermally conductive sheet surface is more preferably 40 μJ or less. If the tacking energy of at least one surface of the thermally conductive sheet is 70 μJ or less, when the thermally conductive sheet is accommodated in the pocket of the emboss carrier tape, which is then protected by the cover film followed by making it a reel, even if the cover film side is in the downside, there is no risk that the thermally conductive sheet is stuck to the cover film whereby reducing the chance of error judgment in the computer control of the automatic mounting process; and thus, the process can be executed without problems. If the tacking energy to the bottom side of the pocket is as mentioned above, there is neither a risk that the thermally conductive sheet is stuck to the pocket's bottom surface, so that it can be sucked up without problems by means of the vacuum nozzle, nor a risk that part of the surface layer of the thermally conductive sheet is taken to the pocket's bottom surface.

Further, it is preferable that the thermally conductive sheet be accommodated in the pocket in such a way that the surface having a smaller tacking energy of the thermally conductive sheet may be on the cover film side.

The tacking energy may be measured by using the tackiness tester TK-1 (manufactured by Malcom Co., Ltd.). Measurement conditions according to the ICP standards are used.

The thermally conductive sheet is preferably a laminate of a reinforcing layer and a thermally conductive resin layer.

Reinforcing Layer:

If the thermally conductive sheet has a reinforcing layer, even in the case that the thickness of the sheet is 600 μm or less, after it is reeled up, even if the pocket of the emboss carrier tape becomes upside down during transportation of it, in the pocket there is neither a risk that the thermally conductive sheet moves to its corner nor a risk that it is bent or turned upside down. Therefore, the thermally conductive sheet can be sucked up properly by the vacuum nozzle during the time of mounting.

In view of the heat releasing performance and the reinforcing capacity, the reinforcing layer is preferably a metal foil, a glass cloth, and a polyimide film. A metal foil having the thickness of 20 μm or more is more preferable. The reinforcing layer of a metal foil having this thickness can not only have sufficient reinforcing strength but also exhibit less effect to the heat releasing performance because of the high thermal conductivity thereof (for example, 237 W/mK for an aluminum foil). More preferable is a metal foil having the thickness in the range of 20 to 150 μm. With this thickness, workability is excellent without losing its flexibility; and in addition, compression performance is excellent.

Illustrative example of the metal foil includes a gold foil, a silver foil, a copper foil, and an aluminum foil. When considering price, workability, ductibility, ductility, and product's stability, an aluminum foil is preferable.

In the case that a thermal conductive resin layer is laminated on the reinforcing layer, the lamination may be done on one side of the reinforcing layer; but the lamination is preferably done on the both sides. When the thermally conductive resin layers are laminated on both sides of the reinforcing layer, intimate contact of the heat-generating part with the cooling part can be bettered at the time of mounting, so that the higher heat releasing effect can be expected.

Thermally Conductive Resin Layer:

Illustrative example of matrix of the thermally conductive resin layer includes rubbers such as an organic rubber, a silicone rubber, a polyurethane gel, a synthetic rubber, and a natural rubber; thermosetting resins such as an epoxy resin and a urethane resin; and a thermoplastic elastomer. The matrix may be formed of the above substances solely or by combination of two or more of them.

In considering heat resistance, cold resistance, weather resistance, and importance of electric characteristics of the thermally conductive sheet in electronic parts, a silicone rubber is preferable.

Thickness of the Thermally Conductive Sheet:

Thickness of the thermally conductive sheet is preferably in the range of 60 μm or more to 600 μm or less.

The thickness is more preferably in the range of 200 μm or more to 400 μm or less. If thickness of the thermally conductive sheet is in the range of 60 μm or more to 600 μm or less, not only the thermal resistance when it is mounted can be lowered but also the stress between the heat-generating part and the cooling part can be relaxed so that a good sheet-moldability can be maintained.

The thermal resistance may be measured according to the ASTM D-5470 measurement method under the condition of 30 psi/100° C./30 minutes.

Thermal Conductivity of the Thermally Conductive Resin:

Thermal conductivity of the thermally conductive resin layer is preferably 1.0 W/mK or more, or more preferably 3.0 W/mK or more.

If the thermal conductivity of the thermally conductive resin is 1.0 W/mK or more, this thermally conductive resin sheet may be used in the heat-generating part which generates a significantly large heat.

The thermal conductivity can be measured by using the hot disc method in which a probe is sandwiched between two specimens prepared by molding a cured thermally conductive silicone into the size of 60×60×6 mm.

Thermally Conductive Filler:

The thermally conductive resin layer contains thermally conductive filler with the amount thereof being preferably 300 parts by mass or more relative to 100 parts by mass of the silicone resin.

If filling amount of the thermally conductive filler is in the range of 200 parts by mass or more to 1300 parts by mass or less relative to 100 parts by mass of the thermally conductive resin, sufficient thermal conductivity of the thermally conductive resin layer can be obtained; and thus, it can be adapted in the heat-generating part which generates a significantly large heat, while having excellent moldability of the thermally conductive sheet as well as excellent flexibility of the molded thermally conductive sheet; the amount thereof is more preferably in the range of 300 parts by mass or more to 1300 parts by mass or less.

Illustrative example of the thermally conductive filler includes those generally considered to be thermally conductive fillers, for example, metals such as nonmagnetic copper and aluminum; metal oxides such as alumina, silica, magnesia, colcothar, beryllia, titania, and zirconia; metal nitrides such as aluminum nitride, silicon nitride, and boron nitride; metal hydroxide such as magnesium hydroxide; an artificial diamond; and silicon carbide. Thermally conductive fillers having the median particle diameter in the range of 0.1 to 200 μm may be used; and these may be used singly or as a composite of two or more of them.

The present invention is a method for feeding a thermally conductive sheet wherein a thermally conductive sheet accommodated in a pocket of the emboss carrier tape of the thermally conductive sheet feeder is fed by sucking up the sheet one by one from the pocket by using a vacuum nozzle whereby carrying out an automatic mounting thereof.

As shown in FIG. 1, according to the method for feeding a thermally conductive sheet of the present invention, because each of the thermally conductive sheets 1 is accommodated in each pocket 2 of the emboss carrier tape 3, many thermally conductive sheets can be arranged without spreading them in a plane; and in addition, because each of the thermally conductive sheets can be taken up at a fixed position by sending the emboss carrier tape 3 little by little with peeling the cover film 4 off, the vacuum nozzle 7 needs only a regular movement. Therefore, in the automatic mounting process of the thermally conductive sheet, the thermally conductive sheet 1 can be sucked up properly by the vacuum nozzle 7, whereby enabling to mount the sheet to a prescribed site, for example, to the semiconductor chip 8 (FIG. 1(A)), so that the automatic mounting process may be made more simple and efficient. On the other hand, according to a feeding method not following the present invention with regard to the method for feeding a thermally conductive sheet, the thermally conductive sheets are set out in a plane thereby requiring a very large space. At this time, because the distance to carry the thermally conductive sheet that is suck up by the vacuum nozzle to the mounting site is different in each sheet; and thus, if number of the thermally conductive sheets that are set out in a plane is large, the distance to the mounting site becomes so long that a risk to drop the sheet off from the nozzle may increase, whereby leading to failure in proper sucking-up of the thermally conductive sheet by the vacuum nozzle 7, as shown in FIG. 1(B) for example, so that the automatic mounting process cannot be made simple and efficient.

EXAMPLES

Hereunder, the present invention will be explained specifically by showing Examples and Comparative Examples; but the present invention is not limited to Examples shown below.

In carrying out Examples and Comparative Examples, components and molding method of the thermally conductive sheet are shown below.

Components of the thermally conductive sheet:

(A-1) Component:

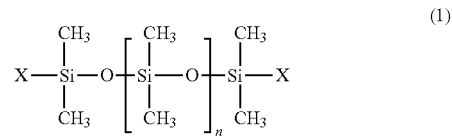

This is the organopolysiloxane whose X is a vinyl group with the viscosity thereof being 600 mm$^2$/second.

(A-2) Component:

This is the methyl vinyl polysiloxane, comprising 99.85% by mole of the dimethyl siloxane unit and 0.15% by mole of the methyl vinyl siloxane unit, with the average degree of polymerization being 8000.

(A-3) Component:

This is poly(2-butyl acrylate).

(B-1) Component:

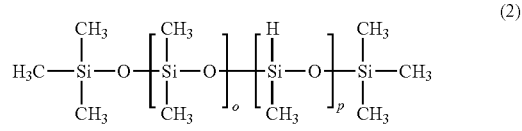

This is the hydrogen polysiloxane whose both terminals are blocked by hydrocarbons with the average degree of polymerization shown below.

Average degree of polymerization: o=28, p=2

(B-2) Component:

This is Denacol EX83D (manufactured by Nagase ChemteX Corp.).

(C) Components:

Aluminum hydroxides having following average particle diameters were used as the thermally conductive filler.

(C-1): Aluminum powder with average particle diameter of 1

(C-2): Aluminum powder with average particle diameter of 10 μm.

(C-3): Alumina with average particle diameter of 1 μm.

(C-4): Alumina with average particle diameter of 10 μm.

(D) Component:

This is the 2-ethylhexanol solution of 5% chloroplatinic acid used as the addition reaction facilitator.

(E) Component:

This is ethynyl methylidene carbinol used as the addition reaction regulator.

when (A-1) or (A-3) was used as the base polymers, or by using a Banbury mixer when (A-2) was used as the base polymer.

Components, blending ratio thereof, and thermal conductivities of the compositions I to VII thus obtained are shown in Table 1.

TABLE 1

|  |  | Composition | | | | | | |
|---|---|---|---|---|---|---|---|---|
|  |  | I | II | III | IV | V | VI | VII |
| A-1 component | | 100 | 100 | — | 100 | 100 | 100 | — |
| A-2 component | | — | — | 100 | — | — | — | — |
| A-3 component | | — | — | — | — | — | — | 100 |
| B-1 component | | 7 | 6 | — | 7 | 6.2 | 6.5 | — |
| B-2 component | | — | — | — | — | — | — | 40 |
| C | C-1 | 200 | 200 | — | — | 300 | 300 | — |
| component | C-2 | 400 | 400 | — | — | 600 | 600 | — |
|  | C-3 | — | — | 500 | 200 | — | — | 200 |
|  | C-4 | — | — | 750 | 300 | — | — | 300 |
| Total of C components | | 600 | 600 | 1250 | 500 | 900 | 900 | 500 |
| D component | | 0.4 | 0.4 | 0.4 | 0.4 | 0.6 | 0.6 | — |
| E component | | 0.15 | 0.15 | — | 0.15 | 0.2 | 0.2 | — |
| F component | | 20 | 20 | 33 | 20 | 33 | 33 | — |
| G component | | 8 | 8 | 8 | 8 | 8 | 8 | — |
| H component | | — | — | 3 | — | — | — | — |
| Ratio of C component relative to matrix resin as 100 | | 443 | 443 | 865 | 369 | 608 | 608 | 357 |
| Thermal conductivity (W/mK) | | 3.1 | 3.1 | 2.7 | 1.5 | 4.3 | 4.3 | 1.5 |

(F) Component:

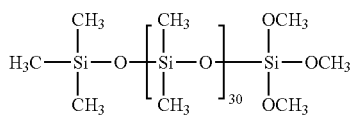

(3)

This is the dimethyl polysiloxane whose one terminal is blocked by a trimethoxysilyl group with the average degree of polymerization being 30.

(G) Component:

This is the dimethyl polysiloxane with r=80 used as the plasticizer.

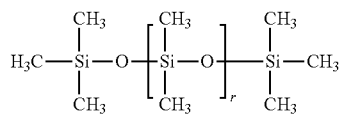

(4)

(H) Component:

This is the vulcanizing agent C-24 (manufactured by Shin-Etsu Chemical Co., Ltd.).

Reinforcing Layer:

Aluminum foil with thickness of 50 μm.

Glass cloth with thickness of 64 μm and with the density of vertically 60 fibers and horizontally 47 fibers/25 mm.

Molding Method of the Thermally Conductive Sheet:

The thermally conductive sheet compositions I to VII were obtained by melt kneading them by using a planetary mixer Toluene was added to each of compositions I to VI to obtain respective toluene solutions, each having concentration of 20%. Each of the solutions is applied on the reinforcing layer by using a spacer for coating; and then after toluene is evaporated at 80° C., curing is conducted at 120° C. When lamination is made on both sides of the reinforcing layer, the toluene solution of the composition is applied also on the other surface. In this case, one surface of the reinforcing layer is made a frontside surface, and the other side is made a backside surface. The composition applied on the frontside surface may be different from the composition applied on the backside surface.

Composition VII was applied on the reinforcing layer without addition of toluene. Curing temperature of 190° C. is used.

In the case of using the glass cloth as the reinforcing layer, the glass cloth needs to be filled in advance. To fill the glass cloth, the same material as the coating material may be used.

Figure 4:
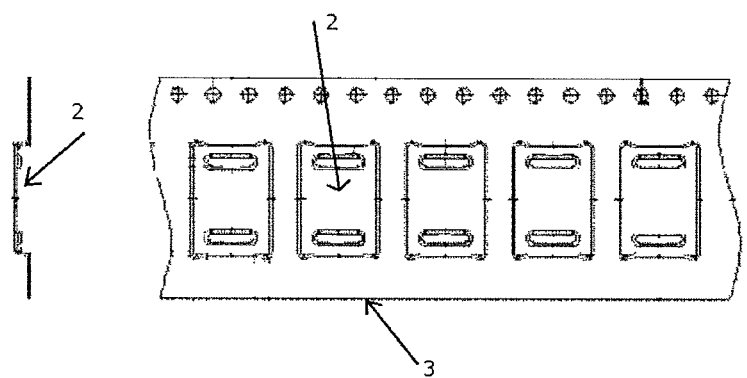
FIG. 4 illustrates a plane view of one example of the emboss carrier tape used in Examples of the present invention and Comparative Examples.

Thermally Conductive Sheet Feeder:

The thermal resistance (K-cm$^2$/W) and the tacking energy (μJ) of the thermally conductive sheet thus obtained were measured. Further, this sheet was cut into the pieces, each having a size of 10×10 mm. From Examples 1 to 5, 1000 pieces of the thermally conductive sheet were accommodated in the pockets of the emboss carrier tape which was made of polycarbonate, as shown in FIG. 4. At this time, the thermally conductive sheet was accommodated in such a manner that the side of the thermally conductive sheet having a smaller tacking energy might be on the side of the cover film. The emboss carrier tape was covered on it by a polyester film for protection; and further, the tape was reeled up to obtain the thermally conductive sheet feeder (Examples 1 to 5).

In Comparative Example 1, each of the obtained thermally conductive sheets was arranged one by one on each tray made of polycarbonate; and in Comparative Example 2, each of the obtained thermally conductive sheets was arranged one by one on a PET film.

Each evaluation of the thermally conductive sheet feeder and of the method for feeding a thermally conductive sheet was done by using the automatic mounting equipment actually with a vacuum nozzle, wherein the area necessary to arrange 1000 thermally conductive sheets and the time to mount them were measured for evaluation.

These results are shown in Table 2.

TABLE 2

|  |  | Example | | | | | Comparative Example | |
|---|---|---|---|---|---|---|---|---|
|  |  | 1 | 2 | 3 | 4 | 5 | 1 | 2 |
| Reinforcing layer | | Aluminum foil (50 μm) | Aluminum foil (50 μm) | Aluminum foil (50 μm) | Aluminum foil (50 μm) | Glass cloth | Aluminum foil | None |
| Cured thermally conductive resin | Frontside surface | I | II | VII | V | III | I | VI |
|  | Backside surface | II | None | None | VI | IV | II | |
| Thickness of cured thermally conductive resin (μm) | Frontside surface | 100 | 300 | 300 | 100 | 90 | 100 | 100 |
|  | Backside surface | 150 | — | — | 150 | 150 | 150 | — |
| Tacking energy of thermally conductive sheet (μJ) | Frontside surface | 47 | 114 | 60 | 35 | 22 | 47 | 20 |
|  | Backside surface | 120 | — | — | 128 | 76 | 120 | 20 |
| Thermal resistance (K·cm²/W) | | 1.12 | 1.35 | 1.82 | 0.89 | 2.31 | 1.12 | 1.45 |
| Feeding embodiment | | Emboss carrier tape | Emboss carrier tape | Emboss carrier tape | Emboss carrier tape | Emboss carrier tape | Setting out on resin tray | Setting out on PET film |
| Area necessary to accommodate 1000 thermally conductive sheets (cm²) | | 400 | 400 | 400 | 400 | 400 | 1200 | 1000 |
| Time necessary to mount 1000 thermally conductive sheets (minutes) | | 15 | 15 | 15 | 15 | 15 | 25 | 25 |

As in the cases of Examples, when the emboss carrier tape is used, the area to accommodate the thermally conductive sheet can be made small, so that the thermally conductive sheet can be stored efficiently. In addition, at the time of mounting, by using the emboss carrier tape, the vacuum nozzle moves regularly and the distance to the mounting site is constant; and thus, mounting can be done efficiently whereby the time for it can be shortened.

In addition, according to the present invention with regard to the thermally conductive sheet feeder and the method for feeding a thermally conductive sheet, during the time of mounting the thermally conductive sheet, the vacuum nozzle can properly suck up the thermally conductive sheet so that the sheet can be fed without problems. On the other hand, in Comparative Examples in which the thermally conductive sheet feeder and the method for feeding a thermally conductive sheet of the present invention are not used, the vacuum nozzle cannot properly suck up the thermally conductive sheet thereby causing mistakes in feeding of the sheet.

The feeding embodiment in which each of the thermally conductive sheets is accommodated one by one in each pocket of the emboss carrier tape of the present invention, is protected by a cover film, and further, the tape is rolled up in a reel-like form is the best embodiment for the automatic mounting process of the thermally conductive sheet, so that this contributes greatly to make the mounting process more efficient. In order to meet the feeding embodiment of the thermally conductive sheet of the present invention, it is preferable that the thermally conductive sheet have a reinforcing layer and that the tacking energy of surface of the sheet on the cover film side be 70 μJ or less.

The invention claimed is:

1. A thermally conductive sheet feeder wherein an emboss carrier tape provided on its surface with a plurality of pockets, each having one thermally conductive sheet accommodated therein, and a cover film to protect surface of the emboss carrier tape are rolled up in a reel form, wherein the thermally conductive sheet is composed of a reinforcing layer, and a thermally conductive resin layer laminated on one surface of the reinforcing layer or thermally conductive resin layers laminated on both surfaces of the reinforcing layer, the thermally conductive resin layers being the same or different; a tacking energy of at least one surface of the thermally conductive sheet is 70 μJ or less; thickness of the thermally conductive sheet is in the range of 60 μm or more to 600 μm or less; the thermally conductive resin layer contains 300 parts by mass or more of thermally conductive filler relative to 100 parts by mass of a silicone rubber; and each thermally conductive sheet is accommodated in each pocket of the emboss carrier tape in the thermally conductive sheet feeder such that the tacking energy of the thermally conductive sheet is the same between a surface of the cover film side and a surface of the pocket's bottom side, or the tacking energy of the thermally conductive sheet of the cover film side is lower than that of the pocket's bottom side.

2. The thermally conductive sheet feeder according to claim 1, wherein thermal conductivity of the thermally conductive resin layer is 1.0 W/mK or more.

3. The thermally conductive sheet feeder according to claim 1, wherein thermal conductivity of the thermally conductive resin layer is 3.0 W/mK or more.

4. The thermally conductive sheet feeder according to claim 1, wherein the reinforcing layer is an aluminum foil.

5. A method for feeding a thermally conductive sheet wherein a thermally conductive sheet accommodated in a pocket of the emboss carrier tape of the thermally conductive sheet feeder according to claim 1 is fed by sucking up the sheet one by one from the pocket by using a vacuum nozzle whereby carrying out an automatic mounting thereof.

6. The thermally conductive sheet feeder according to claim 1, wherein the pockets have a depth such that there is an allowance of 3 to 5 mm above the thermally conductive sheet accommodated therein.

7. The thermally conductive sheet feeder according to claim 1, wherein the reinforcing layer comprises a metal foil having a thickness in the range of 20 to 150 μm.

8. The thermally conductive sheet feeder according to claim 1, wherein the thickness of the thermally conductive sheet is in the range of 200 μm or more to 400 μm or less.

9. The thermally conductive sheet feeder according to claim 1, wherein the thermally conductive resin layer contains 300 parts by mass or more to 1300 parts by mass by less of thermally conductive filler relative to 100 parts by mass of the silicon rubber.

10. The thermally conductive sheet feeder according to claim 1, wherein the thermally conductive filler has a median particle diameter in the range of 0.1 to 200 μm.

* * * * *